(12) United States Patent
Yamamoto et al.

(10) Patent No.: US 7,060,397 B2
(45) Date of Patent: Jun. 13, 2006

(54) EPL MASK PROCESSING METHOD AND DEVICE THEREOF

(75) Inventors: Yo Yamamoto, Chiba (JP); Kouji Iwasaki, Chiba (JP); Masamichi Oi, Chiba (JP)

(73) Assignee: SII NanoTechnology Inc., Chiba (JP)

( * ) Notice: Subject to any disclaimer, the term of this patent is extended or adjusted under 35 U.S.C. 154(b) by 187 days.

(21) Appl. No.: 10/452,541

(22) Filed: Jun. 2, 2003

(65) Prior Publication Data

US 2003/0232258 A1 Dec. 18, 2003

(30) Foreign Application Priority Data

Jun. 11, 2002 (JP) .............................. 2002-169954

(51) Int. Cl.
*G03F 9/00* (2006.01)
*G03C 5/00* (2006.01)

(52) U.S. Cl. ........................... 430/5; 430/30; 430/296; 430/328; 430/394; 430/942

(58) Field of Classification Search ................... 430/5, 430/394, 30, 296, 328, 942
See application file for complete search history.

(56) References Cited

U.S. PATENT DOCUMENTS 4,548,883 A * 10/1985 Wagner ........................ 430/5
5,882,823 A *  3/1999 Neary .......................... 430/5

\* cited by examiner

*Primary Examiner*—Christopher G. Young
(74) *Attorney, Agent, or Firm*—Adams & Wilks

(57) ABSTRACT

A method of correcting a defective portion of an exposure window in a lithography mask, such as an EPL mask, includes a first step of irradiating a defective portion of the exposure window using a charge particle beam to perform correction processing, and a second step of irradiating another portion of the exposure window with the charged particle beam to eliminate attached matter therefrom, the attached matter consisting of particles ejected from the defective portion of the exposure window as a result of irradiation with the charged particle beam during the first step. The first step and the second step are sequentially repeated N times, wherein N is an integer of 2 or more, to thereby reduce the time needed for eliminating the attached matter.

10 Claims, 4 Drawing Sheets

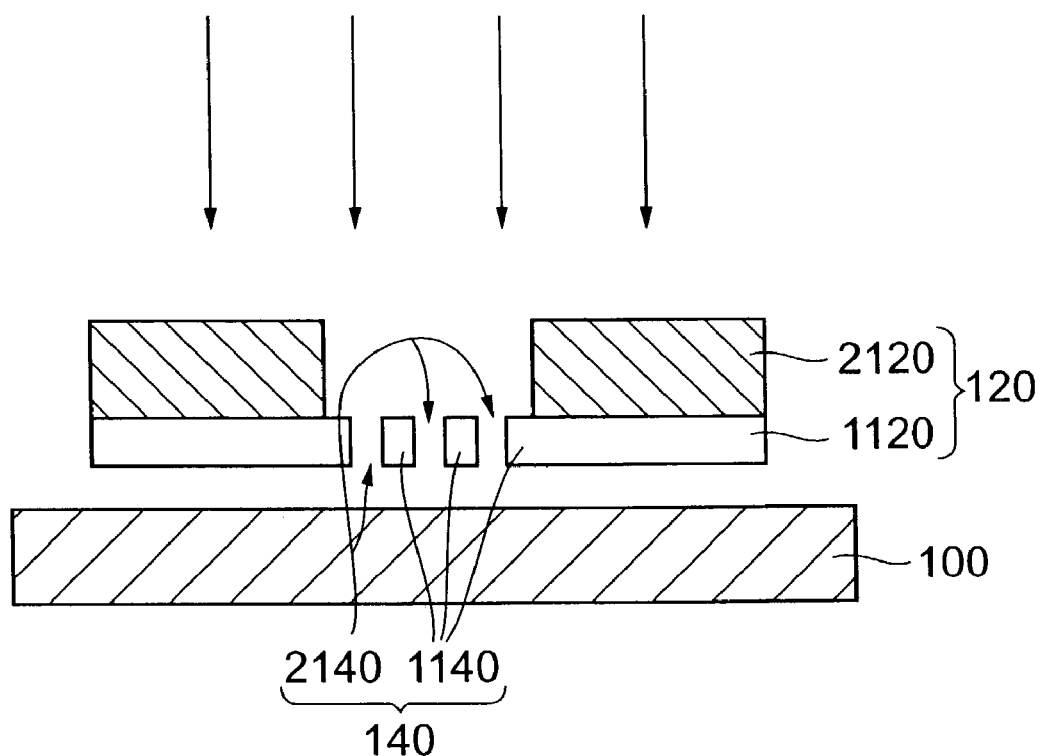

EPL MASK PROCESSING METHOD AND DEVICE THEREOF

BACKGROUND OF THE INVENTION

1. Field of the Invention

The present invention relates to an exposure mask processing method employing a charged particle beam, and particularly relates to an EPL mask processing method (correction method) using electron beam exposure (ELP; Electron beam Projection Lithography).

2. Description of Related Art

Conventionally, mask patterns are used in patterning processes in semiconductor manufacture of the related art. A mask pattern is usually formed of metal provided on a transparent substrate. Light of wavelengths from visible light to ultra-violet is then used to transfer to the photoresist of the mask pattern. This is then used to carry out patterning of a photoresist applied to a wafer.

However, in recent years, fine-detailing of circuit patterns has advanced and patterning to a higher degree of resolution has therefore been necessary in order to form nano-order circuit patterns. Exposure devices employing electron beams (EB) instead of light have therefore been adopted to meet these demands.

Stencil reticule masks (stencil reticules) where a required exposure window is pierced in a thin film of, for example, silicon or diamond, or silicon carbide, or SiC, etc., are well-known as electron beam exposure masks for when electron beams are employed. These electron beam exposure (EPL: Electron beam Projection Lithography) stencil reticule masks transfer patterns to resists using, for example, 100 kVEB exposure devices.

When stripe-shaped windows, i.e. microscopic holes preformed on the stencil reticule mask are not formed according to design, correction of defective windows is carried out because it is necessary to correct window shapes to that of the design. An example employing a charged particle beam processing device in correction of window shapes is disclosed in the document: SPIE 25th Microlithography 2000 (3997-64). According to the device and method disclosed in this document, when the window dimensions opened in this manner are large, this is corrected by deposition, while on the other hand, when the dimensions of the opened window are small, this can be corrected by etching. The mask pattern dimensions are in the order of approximately 100 nm line and space, and processing precision in the order of 10 nm is required. Further, the mask thickness is usually in the order of 0.5 to 2 μm, with high-aspect ratio processing being required for this correction. To achieve this, during processing (etching or deposition) for correcting the stencil reticule masks, particles such as etching shavings or deposition matter etc. become attached onto side-wall surfaces other than the side wall surfaces being processed. A window having a clean wall surface therefore cannot be obtained.

This adhesion has accompanied the densification of LSIs in recent years and the influence of this adhesion cannot now be ignored. It is therefore necessary to remove the attached matter (or attached particles).

A simple description is now given of a related example for carrying out correction processing on a stencil reticule mask (hereinafter referred to simply as "mask") for removing the attached matter. Well known conventional examples of charged particle beam irradiation devices used in the related art are devices including display devices, for example, including SEMs (scanning electron microscopes) for automatically deciding the positioning of a mask to be processed and an irradiating charged particle beam, and control devices for designating a region displayed on a monitor screen to be subjected to correction processing and automatically controlling a charged particle beam to irradiate within this designated region.

These kinds of display devices and control devices are well known and their detailed description is therefore omitted.

FIG. 1 shows a typical process for a process where this attachment occurs and an elimination step thereof. A detailed description is now given with reference to FIG. 1 of the occurrence of attached matter and its removal in the related art.

FIG. 1(A) is a partial plan view showing a mask having a window to be corrected. A window 40 is formed in the mask 10 but a projection 42 remains on part of a sidewall 40b of two facing sidewalls 40a and 40b of this window 40, rendering the window defective. The projection 42 is eliminated through etching, and it is desired to correct the window shape to the designed window shape. In the drawing, an opening 12 is shown between the tip of the projection 42 and the other sidewall 40a.

FIG. 1(B) to FIG. 1(E) are enlarged outline views showing the state of a stencil reticule mask when setting a processing frame. FIG. 1(B) to FIG. 1(E) are views showing a cross-section of a stencil reticule mask 10 within a plane including a central axis of the extracted charged particle beam, taken along line I—I of FIG. 1(A).

<FIG. 1(B): Setting the Processing Frame>

The projection 42 to be removed by etching is designated. This designation is principally carried out in order to indicate that the final line for where the projection 42 is removed by etching is one sidewall 40b of the window 40 as designed. This etching processing is usually carried out while viewing a typical monitor display screen, with the processing frame (eliminated region) set on the display screen shown by a dashed line 20 overlaid on the drawing. The tip of the projection 42 is shown in the drawing as 12a.

<FIG. 1(C): During Processing>

Irradiation of the extracted charged particle beam 30 takes place sequentially from above in the X-direction in the drawings at the region of the projection 42 of the mask 10 on the side within the processing frame 20 from the side of the end surface thereof. When an etching surface (referred to as a "correction processed surface") 12b is formed accompanying etching of the projection 42 by irradiation, shavings 14, i.e. eliminated matter, flies off in all directions (spherically). This eliminated matter 14 becomes affixed to the other sidewall 40a facing the window 40 and is deposited so as to form a deposited layer 14a (refer to FIG. 1(C)).

<FIG. 1(D): When Processing Finishes>

Etching processing using the charged particle beam as described above is carried out in order in the X-direction as shown in FIG. 1(C). This etching surface is one wall surface (sidewall) 40b of the window 40. As a result of the completion of this correction processing, a correction complete window 40 for electron exposure, is formed having a gap width as designed between the facing sidewalls 40a and 40b. During the processing in the correction processing described above in FIG. 1(B) to FIG. 1(D), flying particles of eliminated matter 14 are deposited on the sidewall 40a, and a deposited layer 16 is formed of eliminated matter (shavings) 14 on the sidewall 40a of the window 40.

<FIG. 1(E): Elimination of the Deposited Layer>

Conventionally, this deposited layer 16 is collectively eliminated using the charged particle beam 30 after finishing correction processing of the window 40. Accompanying this removal, newly created eliminated matter 18 is deposited on the etching surface of sidewall 40b and a re-attached layer 18a is formed. This re-attached layer 18a is then removed using the charged particle beam 30.

In this manner, elimination of successively attached matter is complete.

However, in the related method described above, elimination of re-attached matter is carried out immediately after completion of the correction processing. There is therefore the problem that when a certain amount of re-attached matter is deposited, then elimination of the re-attached matter becomes time consuming.

In addition, in the step for eliminating re-attached matter, there is the fear that new attached matter (re-attached matter) may appear in this vicinity.

In order to resolve the aforementioned problems, the present invention sets out to provide an EPL mask processing method for processing a mask pattern in such a manner that re-attached matter occurring when a charged particle beam processing device is employed in mask processing used in an electron beam exposer device is eliminated in a precise and efficient manner.

SUMMARY OF THE INVENTION

In order to achieve this object, an EPL mask processing method of this invention comprises the following configuration and operation.

An EPL mask processing method for processing exposure windows formed in an EPL mask using a charged particle beam comprises the steps of: performing correction processing on a part to be corrected of a window using a charged particle beam; and eliminating attached matter formed as a result of splashed particles from the portion to be corrected becoming attached to a region different to the part to be corrected of the window during correction using a charged particle beam, wherein a sequential cycle of this correction step and elimination step is repeated N times (where N is an integer of 2 or more).

With this configuration and operation, processing may advance while eliminating attached matter even when attached matter becomes attached to the mask pattern.

BRIEF DESCRIPTION OF THE DRAWINGS

FIG. 1 is a view showing an example of an art relating to this invention, where

FIG. 2 is a view showing an example configuration of an EPL mask relating to this invention.

FIG. 4 is a view showing an EPL mask processing method relating to this invention, where

DETAILED DESCRIPTION OF THE PREFERRED EMBODIMENT

Figure 1A:
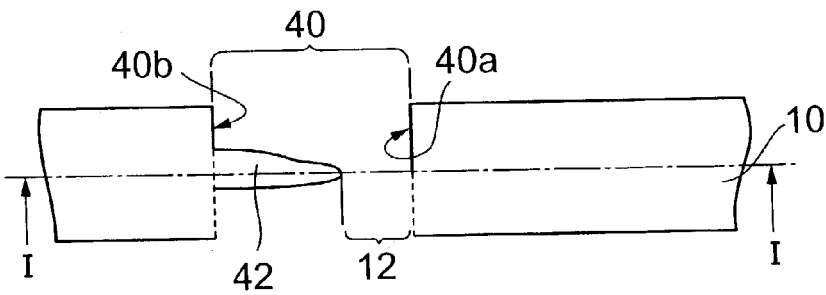
FIG. 1(A) is a plan view of a stencil mask.
Figure 1B:
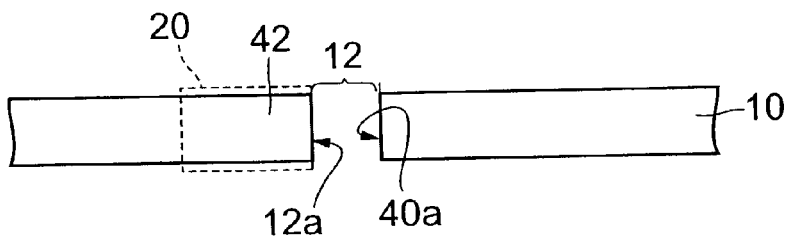
FIG. 1(B) is a view of a processing frame setting step.
Figure 1C:
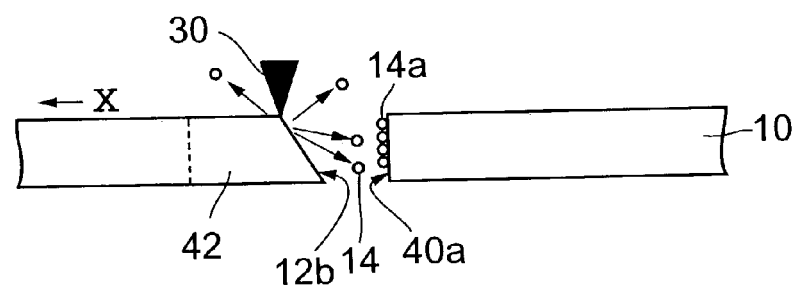
FIG. 1(C) is a view of an etching step.
Figure 1D:
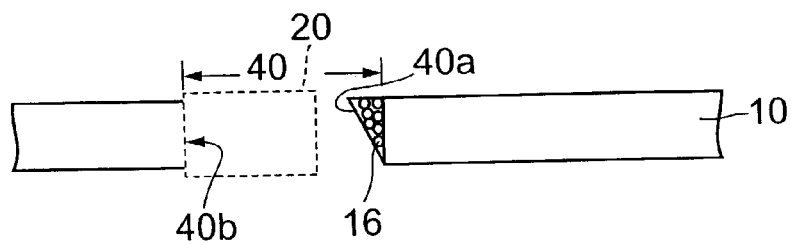
FIG. 1(D) is a view of the end of an etching step.
Figure 1E:
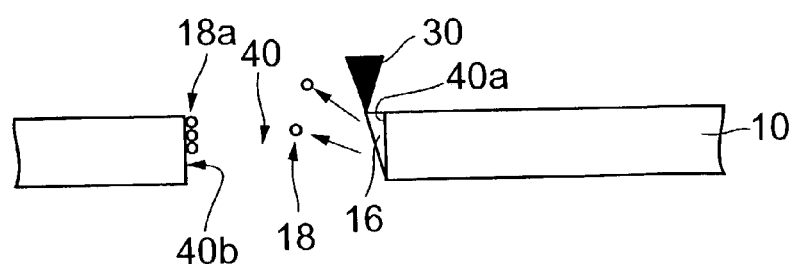
FIG. 1(E) is a view showing an attached matter elimination step.

The following is a description with reference to the drawings of an embodiment of this invention. In the drawings, the relationship of the size, connection, shape and arrangement of each structural component is shown in outline to an extent that this invention may be understood and this invention is therefore by no means limited to that shown in the drawings. Further, hatching showing cross-sections etc. is omitted to a range whereby the structure shown in the drawings does not become unclear.

FIG. 2 is a cross-sectional view illustrating an EPL mask configuration.

First, matter to be processed, for example, a wafer (typically a wafer 10.16 cm (4 inches) in diameter, and 2 mm thick) 100 is mounted on an appropriate sample table (not shown). A plate-shaped stencil mask (reticule) 120 is then positioned so that a 50 µm gap is maintained with the wafer 100. An electron beam source (not shown in the drawings; an outline of the electron beam being shown by arrows in the drawings) is then provided in such a manner as to interpose the stencil mask 120 between the wafer 100 and the electron beam source so that the wafer is capable of being exposed.

This stencil mask 120 basically comprises two types of structural elements.

One of the structural elements is a first plate-shaped body 1120 where the circuit pattern etc. substantially exists, and the other structural element is a second plate-shaped body 2120 pasted to the first plate-shaped body 1120 with the principal object of reinforcing the first plate-shaped body 1120.

The shape of this stencil mask 120 can be decided taking into consideration the size of the matter to be processed. For example, it may be preferable for the diameter of the stencil mask 120 to be 100 mm, the thickness of the first plate-shaped body 1120 to be 0.5 to 2.0 µm, and the thickness of the second plate-shaped body 2120 to be 2 mm.

Further, the substance for the first plate-shaped body 1120 is preferably selected from diamond, silicon carbide, or silicon, and the substance for the second plate-shaped body 2120 is preferably selected as silicon.

At the stencil mask 120, a membrane 140 is formed using the first plate-shaped body 1120 by opening a through-hole in the second plate-shaped body 2120 and a circuit pattern is then formed at this membrane 140. (Refer to FIG. 2)

This membrane 140 is classified into two types of structural elements taking into consideration functional elements. On one side, an electron beam screening pattern 1140 is provided for substantially forming a circuit pattern, and on the other side, an opening (through-hole) 2140 is provided for allowing the electron beam to pass. In other words, microscopic holes are provided in the first plate-shaped body 1120 in parallel with respect to the electron beam for exposure and the screening pattern 1140 is provided about the periphery of these microscopic holes.

These microscopic holes (opening 2140) are typically formed by accelerating ions of a plasma so that these ions collide with the surface so as to cause erosion through Reactive Ion Etching (RIE).

It is then possible to transfer the desired pattern to the wafer using an electron beam for exposure using a stencil mask of this configuration.

Figure 3:
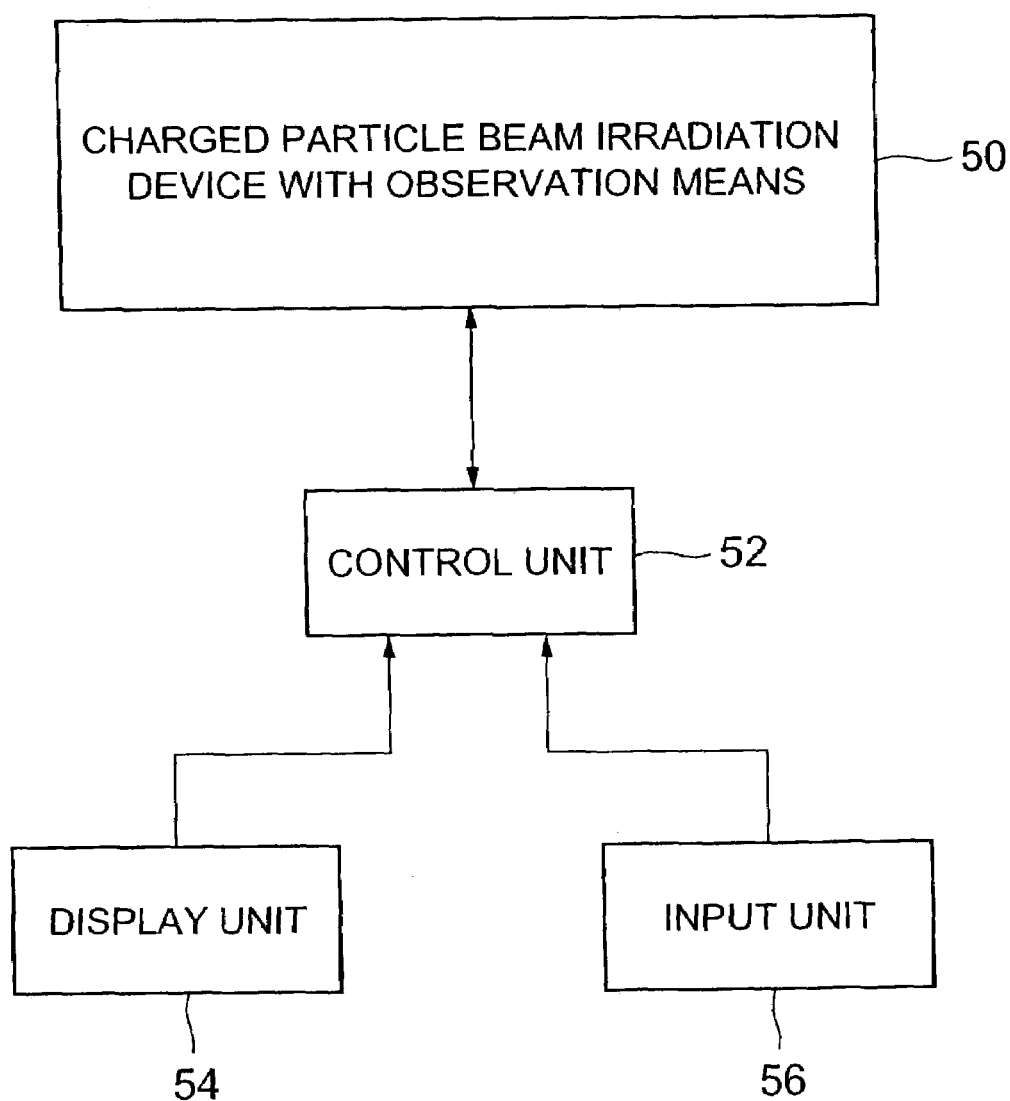
FIG. 3 is a view showing a configuration for a charged particle beam device.

As shown in FIG. 3, the charged particle beam irradiation device 50 used in the correction processing of this invention is a conventional well-known device provided with well-known observation means (not shown in the drawings) such as SEM or SIM. Images observed using this observation means are then displayed on the display screen of a display unit 54 via a control unit 52. In addition to image control of the observation means, as is well-known, the control unit 52 generates control signals for carrying out various types of control in order to cause the charged particle beam device to operate. As is well-known, of this control, control such as positioning of a subject of processing, generation, stopping and moving of a charged particle beam providing irradiation, controlling beam intensity, controlling the inclination angle of the center of a beam, controlling beam irradiation position, and setting of processing frame designating a region to be subject to processing can be controlled from outside as a result of an operator providing input via an appropriate input unit 56. Control provided in order to operate the device may be decided in an appropriate arbitrary manner according to control conditions and may be automatic control or control based on input instructions from an external input unit 56.

"Aforementioned Membrane Processing"

<Processing Frame Setting Process>

Next, a description is given of processing for correcting the membrane 140 using the electron beam exposer of this invention with reference to FIG. 4. As described using FIG. 1(A), the stencil mask window formed once is, for example, a defective window where a projection 420 remains. For each correction process in this case, the stencil mask is installed at the charged particle beam irradiation device 50, this device is made to start moving, and an image of the membrane 140 is displayed on the display unit 54. First, the input unit 56 is operated and the region to be corrected is designated while looking at the observed image on the display screen (refer to FIG. 4(A)). One vertical side of this processing frame 200 is set so as to coincide with an end 420a of the projection 420 or is set towards the side of a facing wall surface 400a of the window 400 from the end 420a. On the other hand, the other vertical side of the processing frame 200 is made to coincide with a final line, i.e. a wall surface 400b of the window 400 to be corrected by etching.

An opening 2140 is shown between the tip 420a of the projection 420 and the wall surface 400a of the window 400.

<Processes During Processing (First Irradiation)>

Figure 4A:
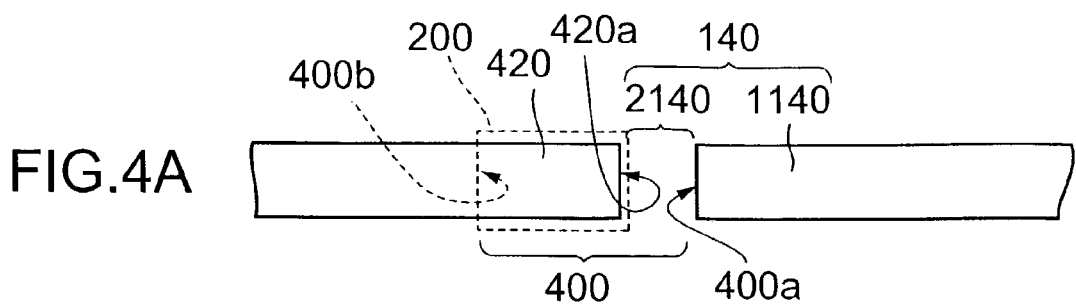
FIG. 4(A) is a view showing processing frame setting.
Figure 4B:
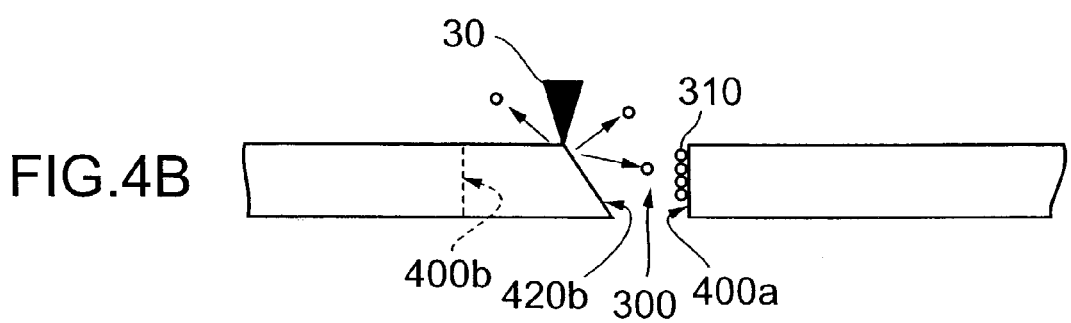
FIG. 4(B) is a view showing a first charged particle beam irradiation step.

After setting of the processing frame 200 on the display screen is complete, the input unit 56 is operated, and as shown in FIG. 4(B), irradiation of the processing frame by the charged particle beam (for example, a Focused Ion Beam) starts in sequence from the side of the opening 2140 (refer to FIG. 4(B)). At this time, as already described, irradiation with the charged particle beam takes place in line with aiming within the region of the processing frame 200 from the side of the tip 420a of the projection 420 to the side of the final line so that the projection 420 is eliminated through etching. Debris such as shavings 300 occurring as a result of etching becomes splashed particles and become affixed to the wall surface 400a of the window 400 facing the projection 420 so as to deposit attached matter 310. The special feature of this invention is that removal of the attached matter 310 attached to the other wall surface region of the window 400 is repeatedly carried out at least twice when performing the correction process up to the final line 400b of the processing frame.

<Attached Matter Elimination Step>

Figure 4C:
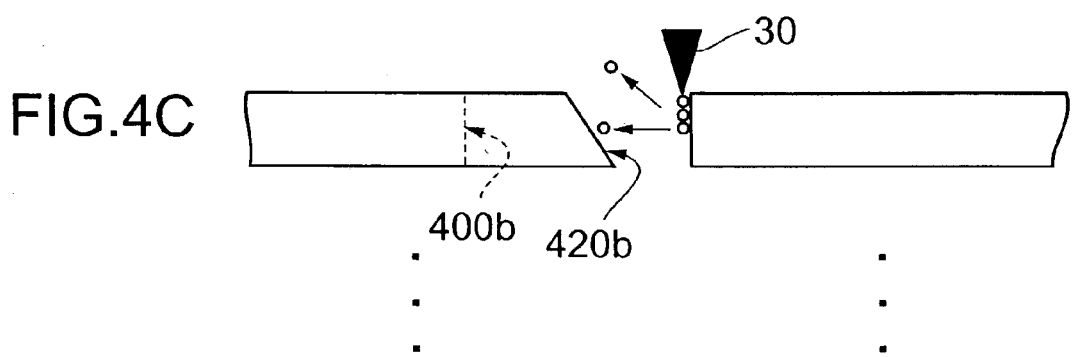
FIG. 4(C) is a view showing a second charged particle beam irradiation step.

During this correction processing, the charged particle beam is aimed at the attached matter 310 so as to irradiate the attached matter 310 with the charged particle beam and the attached matter 310 is removed, as shown in FIG. 4C.

In order to eliminate the attached matter (also referred to as attached layer) 310 formed from splashed particles during the correction process, the position of irradiation of the charged particle beam is moved from the etching surface (referred to as the processing surface) 420b to the side of the sidewall surface 400a facing the etching surface. It is necessary to determine a timing for starting of the elimination of this attached matter 310.

Typically, this is started while the amount of the attached matter is judged to be the amount in which the amount of the reattached matter to other portions of the window caused by the removal of the attached matter does not substantially influence the pattern formed using this window. The removal of the attached matter is conducted when the reattached matter does influence the pattern formed using this window if the attached matter increase any more.

This elimination is then carried out when it is determined that splashed particles occurring due to elimination of the attached matter do influence other portions of the window. The details of this method are described in the following.

A first method is a method that is automatically or manually carried out every time an arbitrary pre-decided fixed period of time elapses. In this case, the time from the start of correction to the time of the start of the first elimination, and the time from a previous elimination to a following elimination etc. may be the same or may be different.

During this elimination, when the attached matter 310 is eliminated through irradiation of a charged particle beam, there is the fear that splashed particles of the attached matter may become re-attached to the etching surface 420b. It is therefore necessary to ensure that attached particles are not substantially deposited on the wall surface 400b during final correction processing, i.e. when a wall surface. 400b is obtained that has the designed shape for the window 400. Taking this point into consideration, attached matter becoming attached to the wall surface 400a can be determined through experimentation so that the amount of matter becoming attached falls within a range where the re-attaching of splashed particles on the etching surface 420b can substantially be ignored and the time of starting of elimination of the attached matter can then be decided.

A second method determines this timing through experimentation while observing the amount of attached matter 310 (attached layer) deposited on the wall surface 400b using the display screen. In this method, a test is carried out a number of times and the timing of the elimination can then be appropriately decided according to the mask material.

Moreover, in a third method, a large number of tests are carried out on the same mask material, data for a relationship between the mask material, the distance between the tip 420a of the projection 420 and the wall surface 400a, the amount of attached matter 310 and the prescribed time is gathered, and may be pre-read in advance from controller memory (not shown) and stored. According to this method, by, for example, designating the mask material from the input unit 56, and designating the distance between the projection and the wall surface to be within a range where the extent of re-attachment does not present any danger, it is possible to start the elimination of the attached matter at a corresponding prescribed time while automatically observing this.

In a fourth method, the atomic pattern of the wall surface 400a before attachment is temporarily stored in memory.

Regarding attached matter after the start of attaching, the wall surface pattern is read out and the atomic pattern is read from the memory, with an operator then comparing both patterns on the display screen of the display unit 54. When the operator then determines from the comparison image for this pattern that elimination of the attached matter is necessary, an instruction is input from the input unit 56 and elimination of the attached matter begins. In the case of this fourth method, it is possible to decide upon an elimination start time at a more appropriate timing through a visual check by the operator.

A fifth method is a method of determining where part of a horizontal deposited layer formed of attached matter 310 on a surface 400a is taken as a reference. In this case, a plurality of numbers of tests are repeated for each mask material, a localized thickness in a horizontal direction constituting the reference for starting elimination of attached matter on the wall surface 400a is set in advance, and data for this reference value for the thickness is stored in advance in memory as data or as a pattern. At the current time, where correction has started and progressed, the thickness is measured or a pattern is read out, automatic comparison of the reference value or the reference pattern is carried out by the control unit 52, and the time of starting elimination of the attached matter is decided. In the case of this method, control is possible in such a manner that elimination of the attached matter 310 starts automatically when there is coincidence with or exceeding of (larger than) the reference value or reference pattern.

As described above, elimination of the attached matter 310 starts after the passage of a certain prescribed time, or at a time appropriate for the elimination. During this time, position correction and angle correction of the charged particle beam is carried out. For example, an operator inputs an instruction from the input unit 56 and give a control signal from the control unit 52 to incline the central line of the charged particle beam that is in the vertical direction during correction processing so that the surface having attached matter eliminated coincides with the wall surface before attachment with respect to the vertical direction.

As already described above, this attached matter elimination step can be repeated at least twice and may be repeated more times if necessary.

After this cycle is repeated N times (where N is a positive integer), the control unit stops the cycle at the time where it is determined that elimination of the attached matter is no longer necessary based on a pre-inputted number of times, or the reference data or reference pattern stored in the memory.

In this manner, the charged particle beam reaches the location of the final line 400b of the processing frame 200 while the processes of correcting the projection 420 and eliminating the attached matter 310 are repeated.

<Process for Eliminating Re-attached Matter (Second Irradiation)>

Figure 4D:
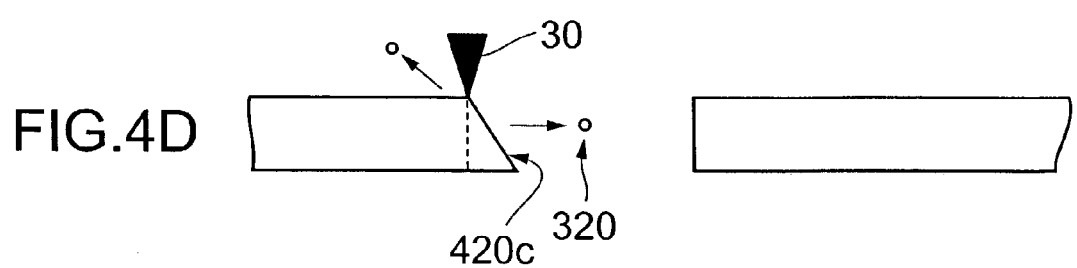
FIG. 4(D) is a view showing a repeated first charged particle beam irradiation step.

FIG. 4(D) shows when the process of correcting the projection 420 reaches as far as where the charged particle beam coincides with the final line 400b and shows the situation where the attached matter 310 is removed from the wall surface 400a of the window 400. During this time, when reattached matter 320 becomes affixed onto the etching surface 420c of the final line 400b, the re-attached matter is eliminated but elimination may also not be carried out if it can be anticipated that the amount attached will not substantially be a detrimental influence on the pattern formed.

<Processing at the End of the Step>

As a portion of the projection 420 remains, position and angle correction of the charged particle beam is carried using instructions from the input unit 56 so that final correction processing is performed to give the desired window pattern shape.

Figure 4E:
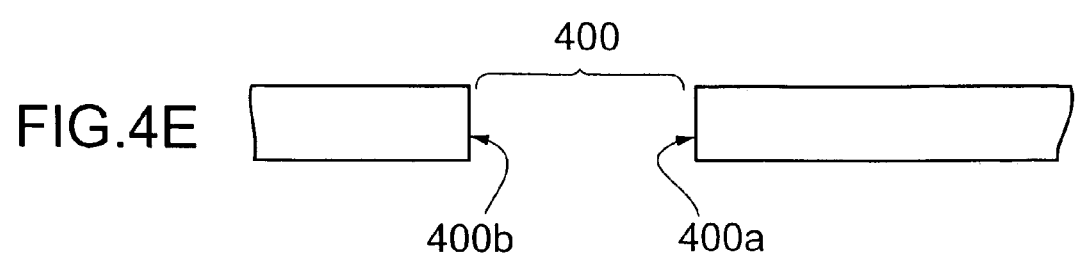
FIG. 4(E) is a view showing the completion of processing.

FIG. 4(E) is a view showing the situation of the membrane 140 at the time of completion of correction processing.

In the aforementioned correction processing step, a series of EPL mask processes are completed.

In the example configuration described above, a description is given of an example where a projecting pattern is removed by etching by irradiating a projection (projecting pattern) remaining on the inside of a regular window pattern with a charged particle beam such as a focused ion beam or electron beam. However, this invention may also be applied to cases where a broader pattern than a regular window pattern is formed and to cases where a material having substantially the same electron scattering efficiency as for an EPL mask material is deposited using charged particle beam-assisted CVD (Chemical Vapor Deposition) to a recess etc. formed in a window wall surface. In this method, first, a gas including a film material is blown onto a mask and when this is then irradiated with a charged particle beam, a chemical reaction is promoted at the irradiation unit and the gas is decomposed. The decomposed gas is divided into a vapor phase component and a solid phase component, with the solid phase component remaining on the mask and constituting a deposition layer. The step of correcting the forming of the deposition layer can also be carried out alternately with elimination of the attached matter.

In addition, the aforementioned EPL mask is applied to an EB stepper for transferring a mask made a number of times larger than the original processing subject after compression using a lens. However, application to other devices is appropriate from the point of view of an EPL mask step (including correction) constituting the object of this invention. For example, the invention may also be applied to a device (LEEPL; Low Energy E-beam Proximity Lithography) projecting a low energy (low acceleration electron beam of approximately 2 kV) electron beam in close proximity (fundamentally 1:1), with the fundamental theory being the same as for the aforementioned EPL.

As is clear from the description given above, the EPL mask processing method of the present invention has substantially no steps to eliminate re-attached matter after processing. The processing can therefore be carried out in a short time and cost reductions (increased throughput) can be achieved in EPL mask manufacture and correction.

What is claimed is:

1. A mask processing method for correcting an exposure window formed in a lithography mask using a charged particle beam, comprising:
    a first step of irradiating a defective portion of the exposure window using the charged particle beam to perform correction processing; and
    a second step of irradiating another portion of the exposure window with the charged particle beam to eliminate attached matter therefrom, the attached matter comprising particles ejected from the defective portion of the exposure window as a result of irradiation with the charged particle beam during the first step;
    wherein the first step and the second step are sequentially repeated N times, wherein N is an integer of 2 or more.

2. A mask processing method according to claim 1; wherein the lithography mask comprises an Electron beam Projection Lithography (EPL) mask.

3. A mask processing method according to claim 1; wherein the defective portion is a projection extending inside of the exposure window, and the first step comprises the step of etching the projection using the charged particle beam.

4. A mask processing method according to claim 1; wherein the defective portion is a recess in a region of the mask outside of the exposure window, and the first step comprises the step of filling-in the recess by forming a deposition layer by charged particle beam-assisted chemical vapor deposition.

5. A mask processing method according to claim 1; wherein the second step is repeatedly carried out at fixed time intervals from the time of starting the first step.

6. A mask processing method according to claim 1; further comprising a third step of determining whether or not the amount of attached matter substantially influences a pattern employing the exposure window, the third step being performed between the first and second steps; wherein the second step is performed after it has been determined in the third step that the pattern is substantially influenced by the attached matter.

7. A mask processing method according to claim 1; further comprising the steps of obtaining an image of an atomic pattern of the other portion of the exposure window prior to performing the first step; and visually observing the other portion of the exposure window while performing the first step to determine if it is necessary to perform the second step.

8. A mask processing method according to claim 1; further comprising the steps of storing a first image of an atomic pattern of the other portion of the exposure window prior to performing the first step; obtaining a second image of the other portion of the exposure window while performing the first step; and comparing the first and second images to determine when it is necessary to perform the second step.

9. A mask processing method according to claim 1; wherein the another portion of the exposure window is spaced apart from the defective portion of the exposure window.

10. A mask processing method according to claim 1; wherein the another portion of the exposure window includes a portion that is spaced from and generally opposite the defective portion of the exposure window.

* * * * *